United States Patent
Chen et al.

(10) Patent No.: US 11,227,957 B1
(45) Date of Patent: Jan. 18, 2022

(54) PROTECTIVE COMPONENT

(71) Applicant: Dong Chen, Shanghai (CN)

(72) Inventors: Dong Chen, Shanghai (CN); Xiaoxuan Chen, Shanghai (CN)

(73) Assignee: Dong Chen, Shanghai (CN)

( * ) Notice: Subject to any disclaimer, the term of this patent is extended or adjusted under 35 U.S.C. 154(b) by 0 days.

(21) Appl. No.: 17/086,148

(22) Filed: Oct. 30, 2020

(30) Foreign Application Priority Data

Oct. 28, 2020 (CN) .......................... 202011170125.0

(51) Int. Cl.
| | |
|---|---|
| *H02G 3/04* | (2006.01) |
| *H01L 31/02* | (2006.01) |
| *H01L 31/05* | (2014.01) |
| *H02S 40/36* | (2014.01) |
| *H02G 3/08* | (2006.01) |

(52) U.S. Cl.
CPC .......... *H01L 31/0201* (2013.01); *H01L 31/05* (2013.01); *H02G 3/083* (2013.01); *H02G 3/088* (2013.01); *H02S 40/36* (2014.12)

(58) Field of Classification Search
CPC .......... H02G 3/083; H02G 3/088; H02G 3/22; H02G 3/24; H02G 3/30; H02G 3/34; H02G 3/04; H02G 3/00; H01L 31/0201; H01L 31/05; H02S 40/00; H02S 40/34; Y02E 10/50
USPC .......... 174/68.1, 68.3, 72 A, 72 R, 653, 654, 174/73.1, 74 R, 88 R, 260; 439/893, 892; 248/49, 68.1, 74.1, 74.2; 138/118, 118.1
See application file for complete search history.

(56) References Cited

U.S. PATENT DOCUMENTS

| | | | |
|---|---|---|---|
| 3,331,917 A | | 7/1967 | O'Keefe et al. |
| 3,859,455 A | * | 1/1975 | Gommans ............ H01R 9/0503 174/88 C |
| 5,505,634 A | * | 4/1996 | Osten .................. H01R 13/6392 439/367 |
| 5,772,462 A | * | 6/1998 | Osten .................. H01R 13/6392 439/367 |

(Continued)

FOREIGN PATENT DOCUMENTS

| | | |
|---|---|---|
| CN | 2468179 | 12/2001 |
| CN | 202004228 | 10/2011 |

(Continued)

OTHER PUBLICATIONS

Chinese Office Action dated Jun. 16, 2021 for Chinese Patent Application No. 202011170125.0. 13 pages.

*Primary Examiner* — Angel R Estrada
(74) *Attorney, Agent, or Firm* — Knobbe, Martens, Olsen & Bear, LLP

(57) ABSTRACT

Provide is a protective component, including a tubular sidewall being elastic and encloses to form a through hole for receiving the wire box connector; a limiting portion provided on an inner wall surface of the tubular sidewall and configured to clamp a recess on the wire box connector; and a tubular protective portion being elastic and is connected to the tubular sidewall to cover an end portion of the tubular sidewall. The protective component of the present disclosure may prevent the protective component from falling off from a wire box connector after mounting to improve mounting efficiency of the wire box connector and may reduce microcracks caused by colliding with a solar cell module.

19 Claims, 15 Drawing Sheets

(56) References Cited

U.S. PATENT DOCUMENTS

| | | | | |
|---|---|---|---|---|
| 5,913,692 A * | 6/1999 | Targett | ............... | H01R 13/6397 |
| | | | | 439/369 |
| 7,029,312 B2 * | 4/2006 | Reid | ....................... | H01R 13/44 |
| | | | | 439/367 |
| 7,767,909 B2 * | 8/2010 | Krabs | ............... | H02G 15/1826 |
| | | | | 174/84 R |
| 7,838,770 B2 * | 11/2010 | Portas | ............... | H02G 15/1826 |
| | | | | 174/84 R |
| 8,653,368 B2 * | 2/2014 | Genco | ....................... | H01R 4/70 |
| | | | | 174/93 |
| 9,537,230 B2 * | 1/2017 | Pope | ........................ | H01R 4/72 |

FOREIGN PATENT DOCUMENTS

| | | |
|---|---|---|
| CN | 202050104 | 11/2011 |
| CN | 104604032 | 5/2015 |
| CN | 206685606 | 11/2017 |
| CN | 207961855 | 10/2018 |
| CN | 109546397 | 3/2019 |
| CN | 208782087 | 4/2019 |
| CN | 209434495 | 9/2019 |
| CN | 111509467 | 8/2020 |
| CN | 211700767 | 10/2020 |
| JP | 2014044862 | 3/2014 |

* cited by examiner

PROTECTIVE COMPONENT

CROSS-REFERENCE TO RELATED APPLICATION

The present application claims priority to Chinese Patent Application No. 202011170125.0, filed on Oct. 28, 2020, the content of which is incorporated herein by reference in its entirety.

TECHNICAL FIELD

The present disclosure relates to the field of solar cell modules and, in particular, to a protective component of a wire box connector for a solar cell module.

BACKGROUND

With the rapid development of solar photovoltaic modules, referring to FIG. 1, a photovoltaic solar cell module includes a module border, a solar cell module back panel, a solar cell panel, a wire box connector located on one side of the solar cell module back panel, a junction box, and a wire. At present, the length of the wire is no less than 1000 mm Therefore, it is necessary to cut the wire and then manually connect the wire to the wire box connector. In the process of mounting the wire box connector to the solar cell module back panel and arrangement of the wire after mounting, the wire box connector is likely to hit the solar cell module back panel, causing micro-cracks to the solar cell module. At present, it is common in the industry to sleeve the wire box connector with foam, so as to avoid the problem that the wire box connector hits the solar cell module back panel and thus causes micro-cracks to the solar cell module.

The inventor of the present application finds that the foam is readily to fall off after the wire box connector is sleeved, so the foam needs to be re-mounted to the wire box connector, and then the wire box connector is mounted to the solar photovoltaic module back panel, which affects mounting efficiency of the wire box connector. In addition, if the foam falls off, micro-cracks will easily occur in the solar cell module when the wire box connector hits the solar cell module back panel.

SUMMARY

According to the embodiments of the present disclosure, the protective component may be prevented from falling off from a wire box connector after mounting to adversely affect mounting efficiency of the wire box connector, and micro-cracks caused by hitting a solar cell module may also be prevented.

Embodiments of the present disclosure provide a protective component, including a tubular sidewall being elastic and encloses to form a through hole for receiving the wire box connector; a limiting portion provided on an inner wall surface of the tubular sidewall and configured to clamp a recess on the wire box connector; and a tubular protective portion being elastic and is connected to the tubular sidewall to cover an end portion of the tubular sidewall.

The protective component provided in the present disclosure is configured to be sleeved on a wire box connector, and the limiting portion protruding from a sidewall to a through hole may fit a recessed portion provided on the wire box connector and recessed inward from an outer surface, so as to prevent the protective component from falling off from the wire box connector after mounting, thereby ensuring mounting efficiency of the wire box connector, which may not lead to micro-cracks caused by the protective component falls off and the wire box connector hits the solar cell module. In addition, the tubular protective portion covers the end portion of the tubular sidewall, and other elements may extend into the tubular protective portion to be plugged into the wire box connector at the end portion of the tubular sidewall. In this way, the tubular protective portion may cover other elements extending into it, further avoiding micro-cracks caused by the other elements hitting the solar cell module.

In an embodiment, the tubular protective portion is a tubular flange connected to the tubular sidewall and disposed around the tubular sidewall, the tubular flange is folded outward from the tubular sidewall and extends along a first direction close to one end of the tubular sidewall, and the tubular flange is foldable relative to the tubular sidewall under an external force to extend in a direction opposite to the first direction to cover the end portion of the tubular sidewall. The tubular protective portion is configured as a foldable flange. When "the wire box connector is assembled to a solar cell panel module", the tubular flange may surround the tubular sidewall, equivalent to adding an additional buffer protection to the periphery of the wire box connector. The wire box connector wrapped by the tubular sidewall and the tubular flange is less likely to collide with a solar cell module to cause micro-cracks. When "the wire box connector assembled to the solar cell panel module is plugged into another component (e.g., a test device connector)", the tubular flange may be folded to extend toward a direction opposite to the first direction to cover the end portion of the tubular sidewall, and then the tubular flange is configured to cover the other components (e.g., the test device connector) extending into it, to avoid micro-cracks caused by the other components (e.g., the test device connector) hitting the solar cell module, so that the same component with different operating states may play different roles in different assembly processes.

In an embodiment, the tubular flange is folded outward from an edge of one end of the tubular sidewall and extends toward a direction close to the other end of the tubular sidewall, and the tubular flange is foldable relative to the tubular sidewall under an external force to extend in a direction facing away from the other end of the tubular sidewall. With such configuration, the foldable tubular flange is connected to an edge of one end of the tubular sidewall and surrounds the tubular sidewall to provide an additional buffer protection. In a process before the assembly of the solar module, when the wire box connector is working in a pipeline, the tubular flange may contact other elements before inference from the tubular sidewall and the other elements, so as to prevent the wire box connector or the tubular sidewall fitting the wire box connector from being impacted, thereby protecting the wire box connector.

In an embodiment, the protective component further includes a collar sleeved on the tubular sidewall, wherein the tubular flange comprises a first wall surface connected to an outer wall surface of the tubular sidewall and a second wall surface opposite to the first wall surface and connected to the inner wall surface of the tubular sidewall, and the first wall surface is provided with an annular groove around a central axis of the tubular sidewall, and the collar is made of an elastic material and is capable of being embedded into the annular groove and fastening the tubular flange when the tubular flange is folded relative to the tubular sidewall under the external force. With such configuration, after the tubular flange covers the other components (e.g., the test device connector) extending into it, relative positions between the tubular flange and the other component may be secured by fastening the collar of the tubular flange, thereby avoiding sliding between the tubular flange and the other component and improving the protection effect.

In an embodiment, the protective component further includes a binding tape, wherein the tubular flange comprises a first wall surface connected to an outer wall surface of the tubular sidewall and a second wall surface opposite to the first wall surface and connected to the inner wall surface of the tubular sidewall, and the first wall surface is provided with an annular groove around a central axis of the tubular sidewall, and the binding tape is made of a flexible material and is capable of being embedded into the annular groove and fastening the tubular flange when the tubular flange is folded relative to the tubular sidewall under the external force. With such configuration, after the tubular flange covers the other components (e.g., the test device connector) extending into it, relative positions between the tubular flange and the other component may be secured by fastening the binding tape of the tubular flange, thereby avoiding sliding between the tubular flange and the other component and improving the protection effect.

In an embodiment, the protective component further includes a skidproof stripe provided in the annular groove. With such configuration, the friction force between the collar/binding tape and the tubular flange may be improved to avoid relative sliding between the collar/binding tape and the tubular flange, thereby improving a tightening/fastening effect between the collar/binding tape and the tubular flange.

In an embodiment, the protective component further includes an annular protrusion provided on the second wall surface and directly facing the annular groove. With such configuration, a fixing effect between the other components (e.g., the test device connector) plugged into the wire box connector and the tubular flange may be improved by aligning or buckling the annular protrusion with or into the other components (e.g., the test device connector).

In an embodiment, a surface of the annular protrusion is provided with the skidproof stripe. With such setting, a fixing effect between the other components (e.g., the test device connector) plugged into the wire box connector and the tubular flange can be improved by aligning or sticking the annular protrusion with or into the other components (e.g., the test device connector).

In an embodiment, a thickness of the tubular flange is greater than a thickness of the tubular sidewall. The thickness of the tubular flange disposed around the tubular sidewall is designed to be greater, which may further improve the protection effect of anti-impact of the tubular flange.

In an embodiment, the tubular protective portion is a sleeve connected to the tubular sidewall, the sleeve extends from an edge of one end of the tubular sidewall toward a direction facing away from the other end of the tubular sidewall, and in a radial direction of the tubular sidewall, a cross-sectional area of the sleeve is greater than a cross-sectional area of the tubular sidewall. With such configuration, after the protective component is mounted to the wire box connector, when the wire box connector is working in a pipeline, the sleeve whose cross-sectional area is greater than that of the tubular sidewall may contact other elements before interference from the tubular sidewall and the other elements, so as to prevent the wire box connector or the tubular sidewall fitting the wire box connector from being impacted, thereby protecting the wire box connector.

In an embodiment, an inner diameter of the sleeve is greater than an inner diameter of the tubular sidewall. With such configuration, the sleeve may not prevent or interfere with the connection between the other components (e.g., the test device connector) and the wire box connector. Therefore, during the testing of the wire box connector, the other components (e.g., the test device connector) may extend into the sleeve to be connected to the wire box connector without removing the protective component from the wire box connector.

In an embodiment, a sidewall thickness of the sleeve is greater than the thickness of the tubular sidewall. The sidewall thickness of the sleeve is set to be thicker, so that its anti-deformation capability is better when it is squeezed and collided, and its anti-impact buffering effect is improved.

In an embodiment, a width of the limiting portion in an axial direction of the tubular sidewall is in a range from 13 mm to 17 mm.

In an embodiment, the limiting portion is provided with a skidproof stripe. With such configuration, the friction force between the limiting portion and the wire box connector may be increased, which ensures that sliding between the two is not readily occurred, thereby improving the fixing effect.

In an embodiment, a first groove recessed toward the limiting portion is provided on an outer wall surface of the tubular sidewall at a position directly facing the limiting portion. With such configuration, wall thicknesses of the tubular sidewall may be the same at each position, thereby making the protective assembly easier to manufacture.

In an embodiment, the tubular sidewall is provided with an easy-to-tear opening. After the wire box connector is tested and assembled, the protective component may be removed through the easy-to-tear opening, which is simple and convenient to operate.

In an embodiment, the inner wall surface of the tubular sidewall is provided with a skidproof stripe. With such configuration, the friction between the wire box connector and the tubular sidewall may be increased, which ensures that sliding will not easily occur between the two, thereby improving the fixing effect.

In an embodiment, the tubular sidewall, the limiting portion, and the tubular protective portion are integrally formed.

In an embodiment, the protective component is made of a sheet material coiled and connected end to tail.

In an embodiment, the protective component is made of silica gel.

BRIEF DESCRIPTION OF DRAWINGS

The embodiments are illustrated according to the accompanying drawings corresponding thereto, which do not limit the embodiments. Elements having the same reference signs in the accompanying drawings are represented as same or similar elements. Unless specifically stated, the figures in the accompanying drawings do not constitute limitations in scale.

DESCRIPTION OF EMBODIMENTS

Figure 1:
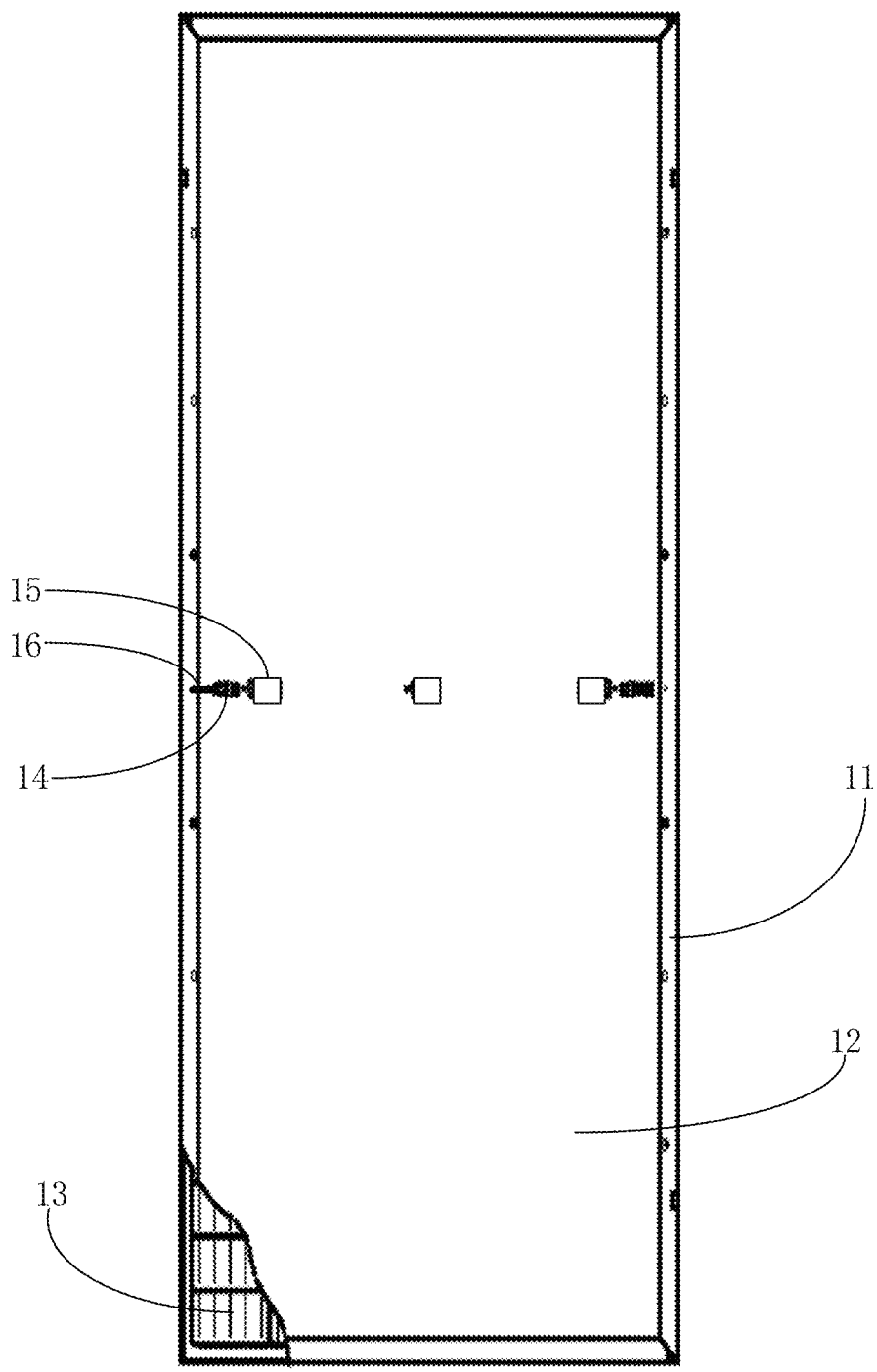
FIG. 1 is a schematic structural diagram of a solar cell module of the prior art.

It can be seen from the background portion that in the prior art, a circular straight foam is readily to fall off from a wire box connector after the wire box connector is sleeved; therefore, after falling off, the circular straight foam needs to be re-mounted to the wire box connector, thereby adversely affecting the mounting efficiency of the wire box connector. Moreover, if the straight foam falling off is not timely re-mounted to the wire box connector, micro-cracks are readily to occur in the solar cell module when the wire box connector hits the solar cell module back panel.

Embodiments of the present disclosure provide a protective component. The protective component is sleeved on a wire box connector. The protective component mainly includes a tubular sidewall, a limiting portion, and a tubular protective portion. The tubular sidewall is elastic and defines a through hole for receiving the wire box connector. The limiting portion is disposed on an inner wall surface of the tubular sidewall, and is configured to clamp a recess on the wire box connector. The tubular protective portion is elastic, is connected to the tubular sidewall, and is capable of covering an end portion of the tubular sidewall therein.

The protective component provided in the present disclosure is configured to be sleeved on a wire box connector, and the limiting portion protruding from a sidewall to a through hole may fit a recess provided on the wire box connector and recessed inward from an outer surface, so as to prevent the protective component from falling off from the wire box connector after mounting, thereby ensuring mounting efficiency of the wire box connector, which may not lead to micro-cracks caused by the protective component falls off and the wire box connector hits the solar cell module. In addition, the tubular protective portion covers the end portion of the tubular sidewall therein, and other elements may extend into the tubular protective portion to be plugged into the wire box connector at the end portion of the tubular sidewall. In this way, the tubular protective portion may cover other elements extending into it, further avoiding micro-cracks caused by the other elements hitting the solar cell module.

To better illustrate the objectives, technical solutions, and advantages of the embodiments of the present disclosure, the embodiments of the present disclosure are elaborated in detail below with reference to the accompanying drawings. However, those of ordinary skill in the art may understand that lots of technical details are presented in the embodiments of the present disclosure to enable the reader to better understand the present disclosure. However, even in the absence of the technical details and variations and modifications based on the following embodiments, the technical solution for which protection is sought by the present disclosure may also be implemented.

Details of this implementation mode are specifically described below. The following is only for the convenience of understanding the implementation details provided and may not be necessary for the implementation of the solution.

Figure 2:
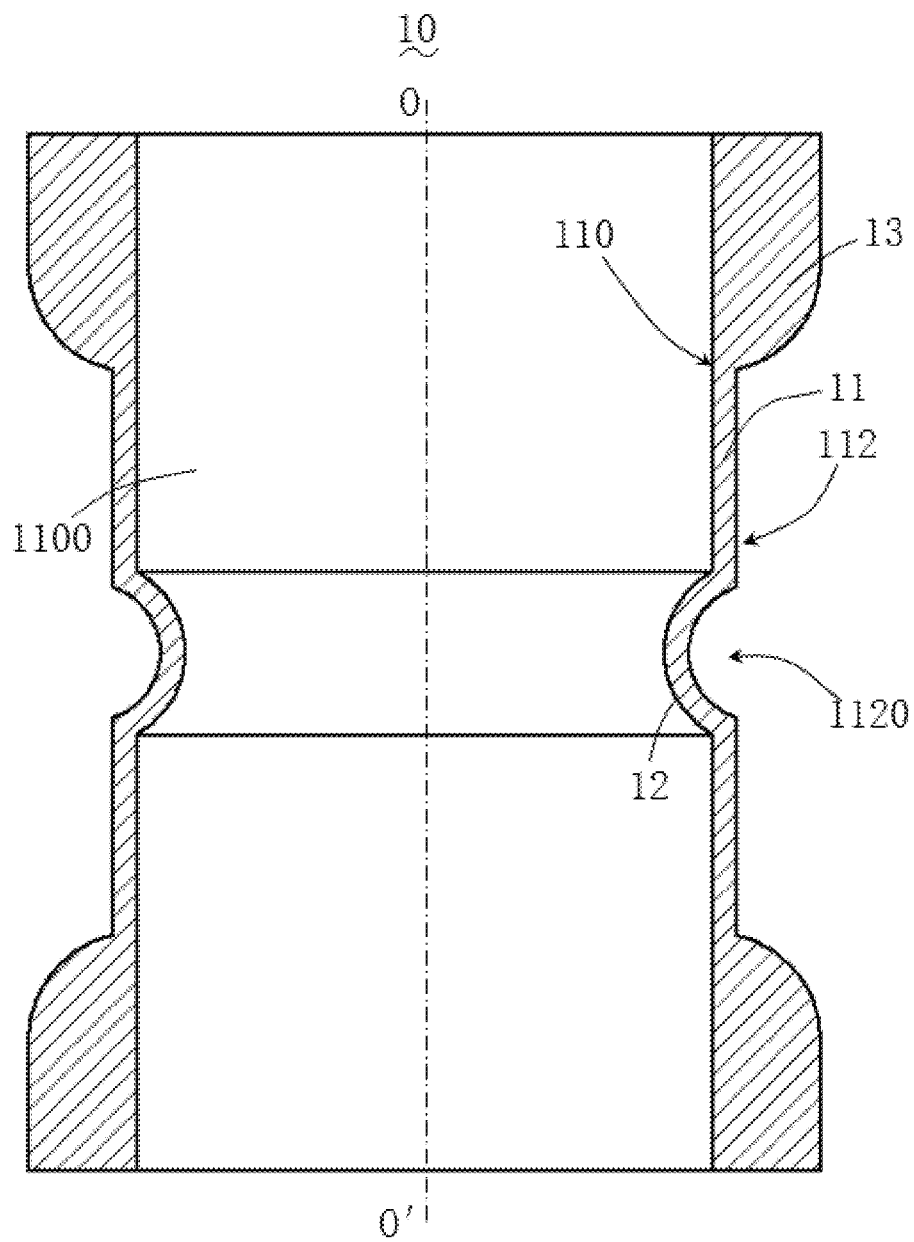
FIG. 2 is a sectional view of a protective component according to Embodiment 1 of the present disclosure.
Figure 3:
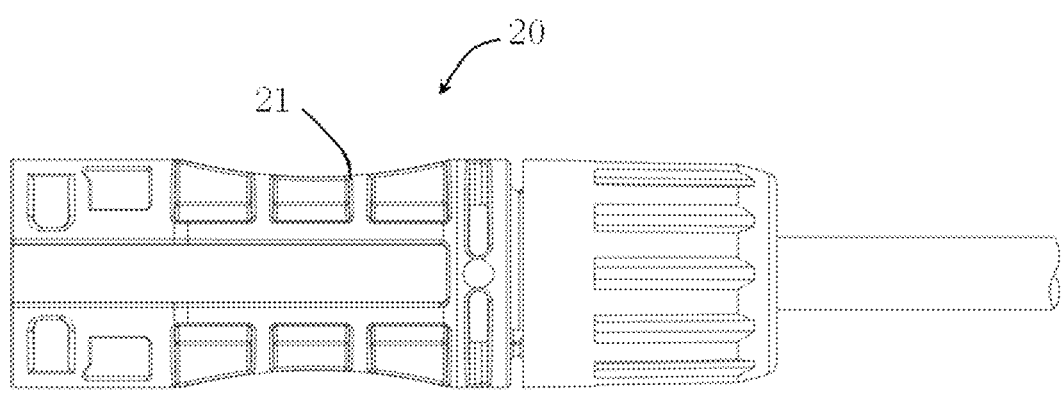
FIG. 3 is a sectional view of a wire box connector according to Embodiment 1 of the present disclosure.

Embodiment 1 of the present disclosure provides a protective component (hereinafter referred to as protective component 10). Referring to FIG. 2 and FIG. 3, FIG. 2 is a sectional view of a protective component 10 according to Embodiment 1 of the present disclosure, and FIG. 3 is a schematic structural diagram of a wire box connector 20 used in conjunction with the protective component 10 shown in FIG. 2 according to Embodiment 1 of the present disclosure. The protective component 10 according to Embodiment 1 of the present disclosure includes: a tubular sidewall 11, a limiting portion 12, and a sleeve 13.

The tubular sidewall 11 is made of an elastic material, for example, silica gel. The elastic tubular sidewall 11 may be sleeved on the wire box connector 20 as shown in FIG. 3, to provide a buffer when the wire box connector 20 collides with the solar cell module back panel as shown in FIG. 1, thereby avoid causing micro-cracks on the solar panel.

For example, the tubular sidewall 11 has an inner wall surface 110 and an outer wall surface 112 opposite to each other. The inner wall surface 110 surrounds a central axis OO' of the tubular sidewall 11 to define a through hole 1100 for receiving the wire box connector 20. The through hole 1100 is substantially cylindrical, thereby receiving the wire box connector 20 that is substantially cylindrical.

The limiting portion 12 is disposed on the inner wall surface 110, and is configured to clamp a recess 21 (see FIG. 3) on the wire box connector 20. In this embodiment, the limiting portion 12 is a protrusion extending from the inner wall surface 110 to the through hole 1100. Referring to FIG. 3 together, the wire box connector 20 is provided, between two ends, a recessed portion 21 recessed inward from an outer surface. In the process of mounting the protective component 10 provided in this embodiment, the wire box connector passes through the through hole 1100, so that the limit portion 12 is embedded into the recessed portion 21 of the wire box connector 20, and then the protective component 10 is sleeved on the wire box connector 20. In this embodiment, the limiting portion 12 is disposed between two ends of the tubular sidewall 11. Further, since the recessed portion 21 of the wire box connector 20 is disposed in the middle of the wire box connector 20, the limiting portion 12 is disposed in the middle of the tubular sidewall 11, so that the tubular sidewall of the protective component 10 better fits the wire box connector 20.

For example, in this embodiment, a width of the limiting portion 12 in an axial direction (that is, the direction of the OO' axis) of the tubular sidewall is in a range from 13 mm to 17 mm (millimeter). It may be understood that in order to increase the friction between the limiting portion 12 and the wire box connector 20 to ensure that sliding will not easily occur between the two to improve the fixing effect, in this embodiment, the limiting portion 12 may be provided with an additional skidproof stripe (not shown in the figure). Besides, a first groove 1120 recessed toward the limiting portion 12 is further provided on the outer wall surface 112 at a position directly facing the limiting portion 12. Since the limiting portion 12 is a protrusion, the first groove 1120 directly facing the limiting portion 12 may reduce a wall thickness at the limiting portion 12, so that wall thicknesses of the tubular sidewall 11 are the same at each position, which saves raw materials for manufacturing the protective component 10 without affecting the function of the limiting portion 12, thereby saving manufacturing costs. Moreover, the wall thickness at the limiting portion 12 is close to the wall thickness at other parts of the tubular sidewall 11, so that a molten material flows better in a mold cavity when the tubular sidewall 11 is made by injection molding, thereby making the protective component 10 easier to manufacture. As an example, the inner wall surface 110 of the tubular sidewall 11 may be further provided with an additional skidproof stripe (not shown in the figure). With such configuration, the friction between the wire box connector 20 and the inner wall surface 110 of the tubular sidewall 11 may be increased, which ensures that sliding will not easily occur between the two, thereby improving the fixing effect.

The sleeve 13 is connected to the tubular sidewall 11 and is made of an elastic material, for example, silica gel. For example, the sleeve 13 extends from an edge of one end of the tubular sidewall 11 (a top end of the tubular sidewall 11 shown in FIG. 2) to a direction facing away from the other end of the tubular sidewall 11 (a bottom end of the tubular sidewall 11 shown in FIG. 2), and in a radial direction of the tubular sidewall 11 (i.e., a direction perpendicular to the OO' axis), a cross-sectional area of the sleeve 13 is greater than that of the tubular sidewall 11.

In this way, the sleeve 13 covers the end of the tubular sidewall 11 (i.e., the top end of the tubular sidewall 11 shown in FIG. 2) therein, to form a tubular protective portion. With such configuration, after the protective component 10 is mounted to the wire box connector 20, when the wire box connector is working in a pipeline, the sleeve 13 whose cross-sectional area is greater than that of the tubular sidewall 11 may contact other elements before the tubular sidewall 11 interferes with the other elements, so as to prevent the wire box connector 20 or the tubular sidewall 11 fitting the wire box connector 20 from being impacted, thereby protecting the wire box connector 20.

In an embodiment, an inner diameter of the sleeve 13 is greater than that of the tubular sidewall 11. With such configuration, the sleeve 13 may not prevent or interfere with the connection between the other components (e.g., the test device connector) and the wire box connector 20. Therefore, during the testing of the wire box connector 20, the other components (e.g., the test device connector) may extend into the sleeve to be connected to the wire box connector without removing the protective component 10 from the wire box connector 20. In another embodiment, the sidewall thickness of the sleeve 13 may also be set to be greater than the thickness of the tubular sidewall 11, and the sidewall thickness of the sleeve 13 is set to be thicker, so that its anti-deformation capability is better when it is squeezed and collided, and its anti-impact buffering effect is improved.

In addition, the tubular sidewall 11, the limiting portion 12, and the sleeve 13 of the protective component 10 may be integrally formed. The manufacturing method of integral forming may save manufacturing steps, and the process is mature, simple, and low-cost, such as injection molding. The protective component 10 may be made of silica gel. The silica gel has a long service life, and the protective component 10 may be recycled to avoid a waste of resources. It is appreciated that, it may be understood that the protective component 10 may also be made of rubber or other elastic materials.

Further, a feasible structural design for Embodiment 1 of the present disclosure is provided as follows: a height of the protective component 10 along the OO' direction may be in a range from 68 mm to 72 mm (millimeter). A minimum inner diameter of the protective component 10 may be in a range from 15 mm to 19 mm, and a maximum inner diameter may be in a range from 28 mm to 32 mm A width (or referred as height) of the limiting portion 12 in the OO' direction may be in a range from 13 mm to 17 mm A height of the sleeve 13 in the OO' direction may be in a range from 13 mm to 17 mm.

In an embodiment, the height of the protective component 10 along the OO' direction is 70 mm. The minimum inner diameter of the protective component 10 is 17 mm, and the maximum inner diameter is 30 mm. The width (or referred as height) of the limiting portion 12 in the OO' direction is 15 mm. The height of the sleeve 13 in the OO' direction is 15 mm. Further, since the height of the protective component 10 along the OO' direction is 70 mm, heights of sleeves 13 disposed on two ends of the tubular sidewall 11 in the OO' direction are both 15 mm, and the height of the tubular sidewall 11 along the OO' direction is 40 mm Since the width of the wire box connector 20 currently used for photovoltaic solar cell modules is 40 mm and the minimum outer diameter is 15 mm, the width of the tubular sidewall 11 in the OO' direction is the same as the width of the wire box connector 20, so that the tubular protective portion 15 provides better protection for the wire box connector 20. The minimum inner diameter of the protective component 10 is only 2 mm greater than the minimum outer diameter of the wire box connector 20, which may prevent the protective component 10 from falling off from the wire box connector 20 while facilitating the protective component 10 to be sleeved on the wire box connector.

It should be noted that the above sizes of the protective component 10 are designed according to the existing wire box connector 20. When the size of the wire box connector 20 changes, the sizes of the protective component 10 may also change accordingly.

Figure 4:
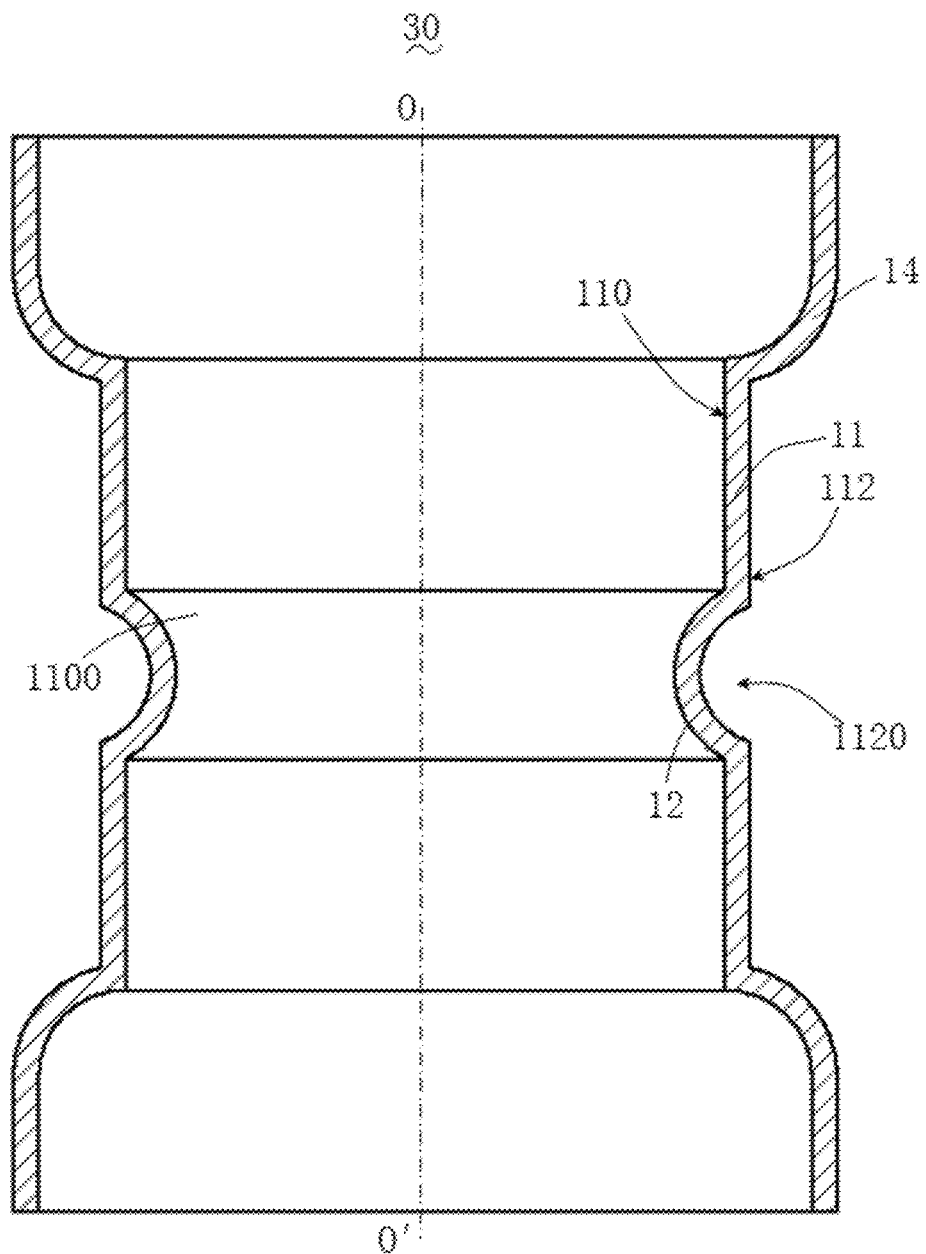
FIG. 4 is a sectional view of a protective component according to Embodiment 2 of the present disclosure.
Figure 5:
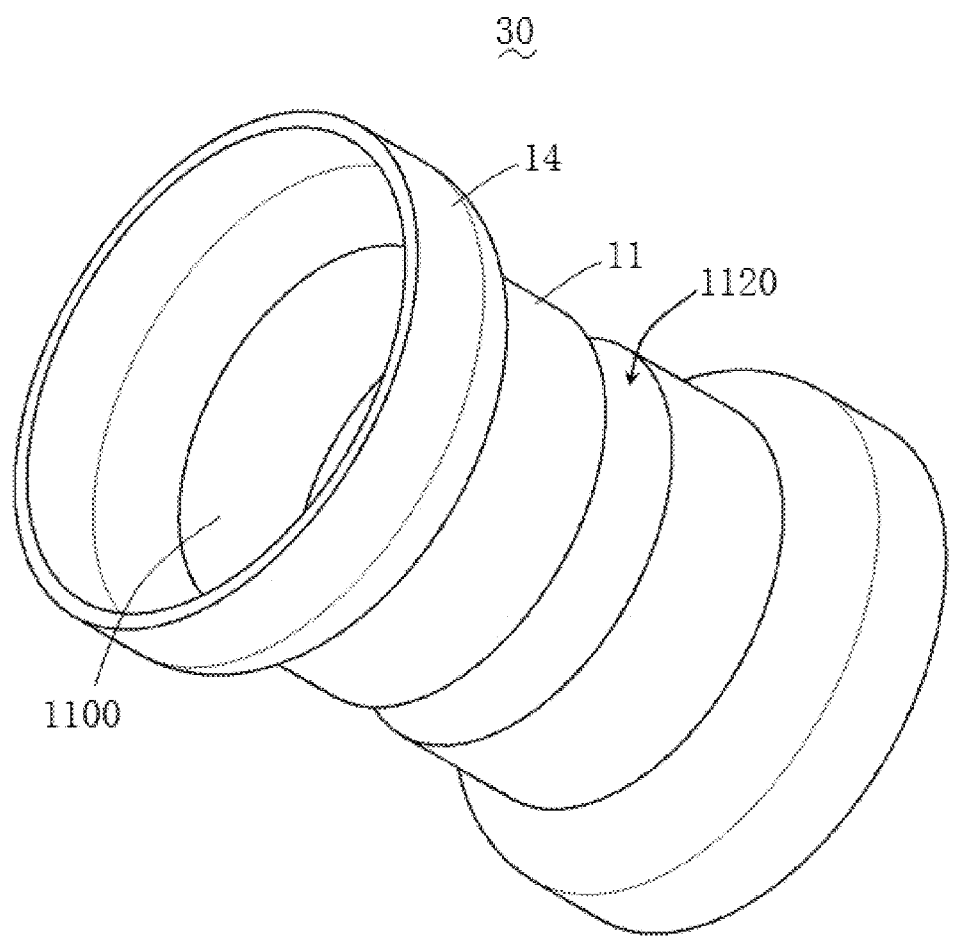
FIG. 5 is a schematic perspective structural diagram of the protective component according to Embodiment 2 of the present disclosure.
Figure 6:
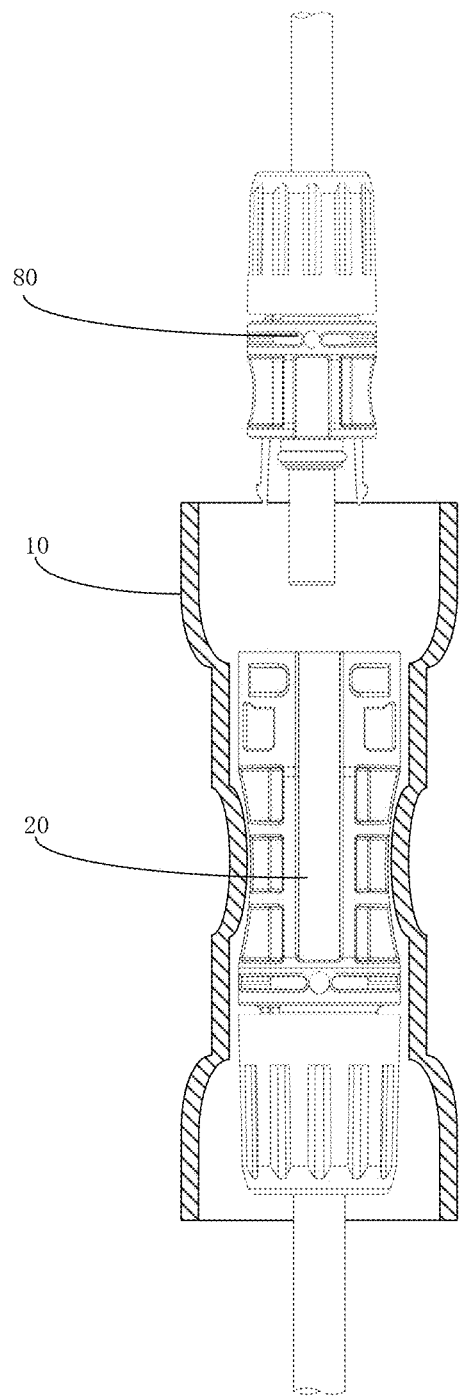
FIG. 6 is a schematic assembly diagram of the protective component according to Embodiment 2 of the present disclosure.

Embodiment 2 of the present disclosure provides another protective component (hereinafter referred to as protective component 30). Referring to FIG. 4, FIG. 5, and FIG. 6, FIG. 4 is a sectional view of a protective component 30 according to Embodiment 2 of the present disclosure, FIG. 5 is a schematic perspective structural diagram of the protective component 30 according to Embodiment 2 of the present disclosure, and FIG. 6 is a schematic diagram of the protective component 30 according to Embodiment 2 of the present disclosure during use. The protective component 30 according to Embodiment 2 of the present disclosure is substantially the same as the protective component 10 according to Embodiment 1 of the present disclosure. The difference lies in that, in Embodiment 2, the tubular protective portion is a sleeve 14 whose inner diameter is greater than that of the tubular sidewall 11, as shown in FIG. 4 and FIG. 5.

Since the wire box connector 20 needs to be tested before the wire box connector 20 is mounted, in the previous testing process, the circular straight foam needs to be removed from the wire box connector 20 first, and then a test device connector 80 is connected to the wire box connector 20, so as to test the wire box connector 20. Further referring to FIG. 6, in this embodiment, during testing of the wire box connector 20, the test device connector 80 may pass through the sleeve 14 to be connected to the wire box connector 20. Since the inner diameter of the sleeve 14 is greater than that of the tubular sidewall 11, during testing of the wire box connector 20, it may not prevent or interfere with the connection of the test device connector 80 to the wire box connector 20, and thus the protective component 10 does not need to be removed from the wire box connector 20.

It may be understood that when "the wire box connector 20 assembled to the solar cell panel module" is plugged into other components other than the test device connector, the sleeve 14 still may perform the above function, and the sleeve 14 may be additionally configured to cover other components extending into it, thereby avoiding microcracks caused by the other components hitting the solar cell module.

In addition, in this embodiment, the wall thickness of the sleeve 14 is the same as that of the tubular sidewall 11. In case of injection molding, the protective component 10 may provide better mobility and strong mold filling capacity for the tubular sidewall 11, the limit portion 12, and the sleeve 14.

Figure 7:
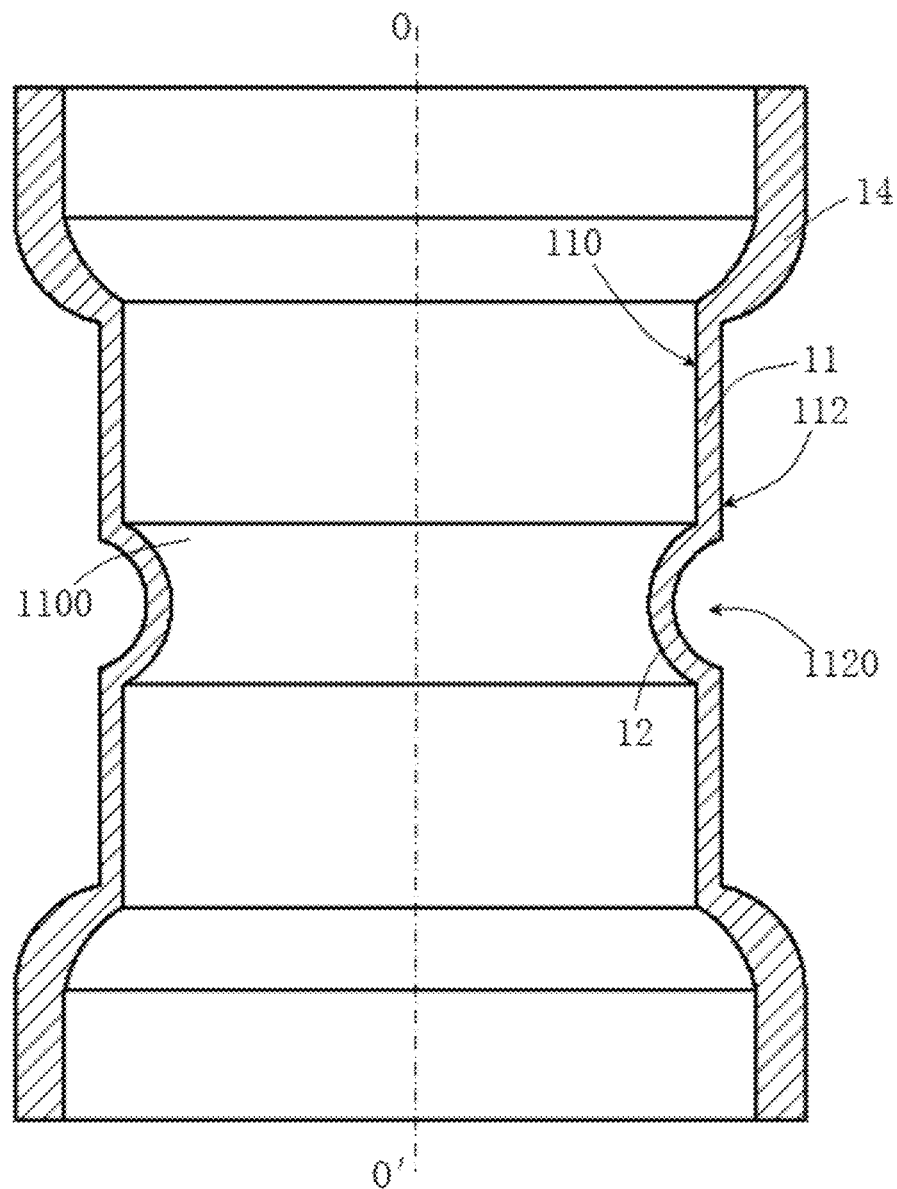
FIG. 7 is a sectional view of the protective component according to Embodiment 2 of the present disclosure.

It should be indicated that referring to FIG. 7, in Embodiment 2 of the present disclosure, a sidewall thickness of the sleeve 14 may further be set to be greater than the thickness of the tubular sidewall 11. When the wire box connector 20 is working in a pipeline, the wire box connector 20 is readily to collide with other elements, thereby damaging the wire box connector 20. When the sidewall thickness of the sleeve 14 is greater than that of the tubular sidewall 11, the bending resistance of the sleeve 14 is stronger and the buffering protection capability is better, so as to provide better protection.

Figure 10:
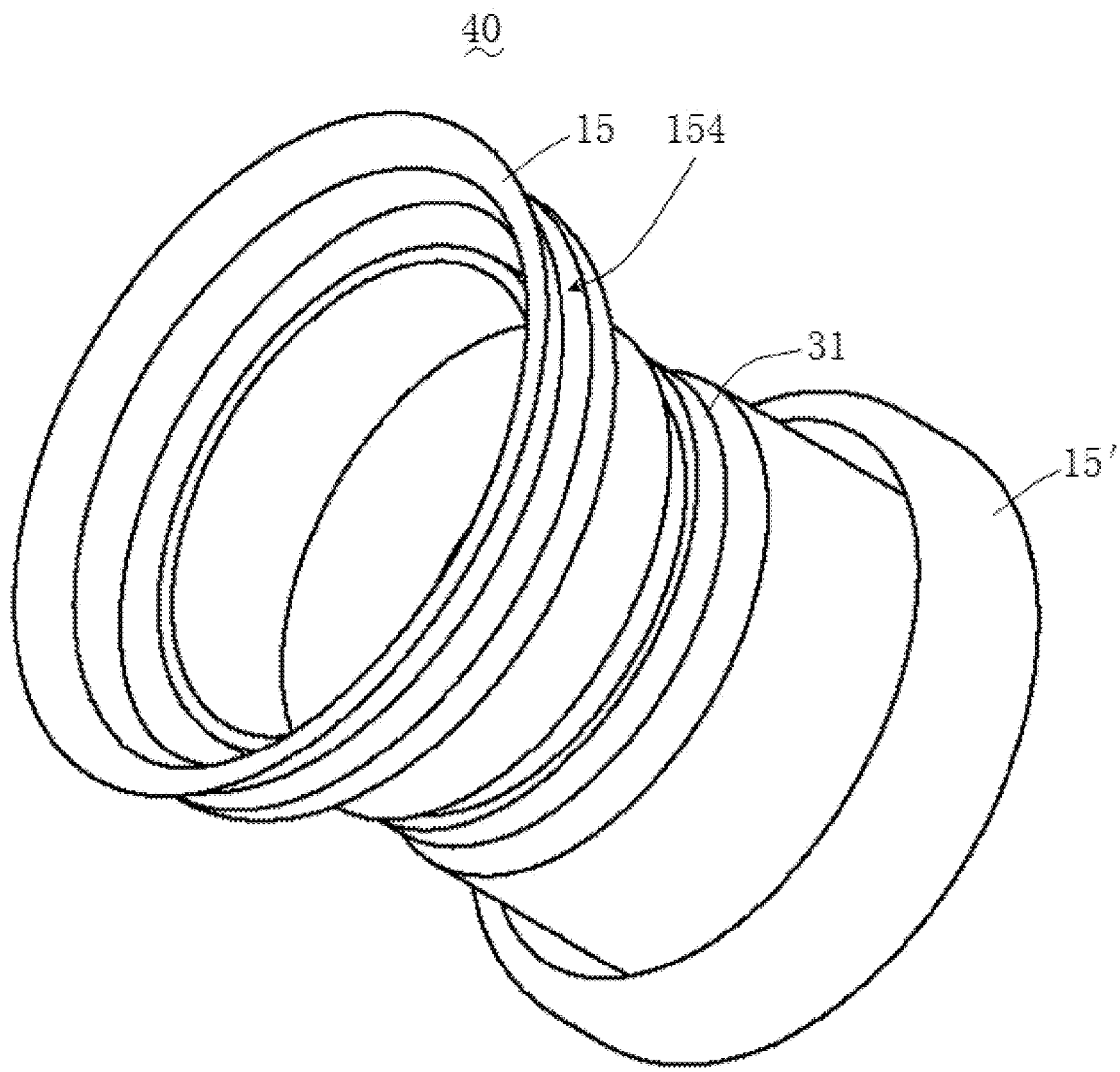
FIG. 10 is a schematic perspective structural diagram of the protective component according to Embodiment 3 of the present disclosure when in a folded state.
Figure 11:
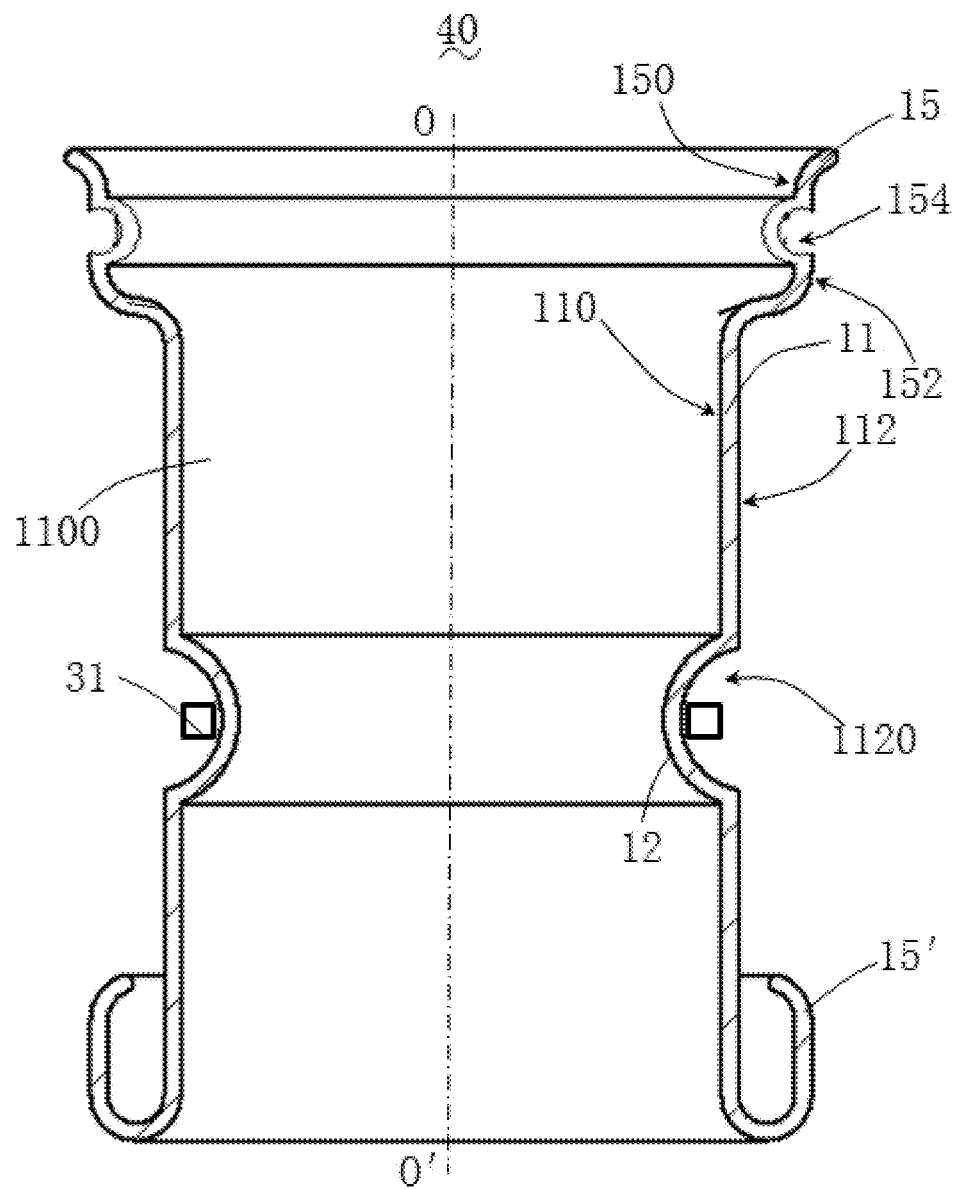
FIG. 11 is a sectional view of the protective component according to Embodiment 3 of the present disclosure when in a folded state.
Figure 12:
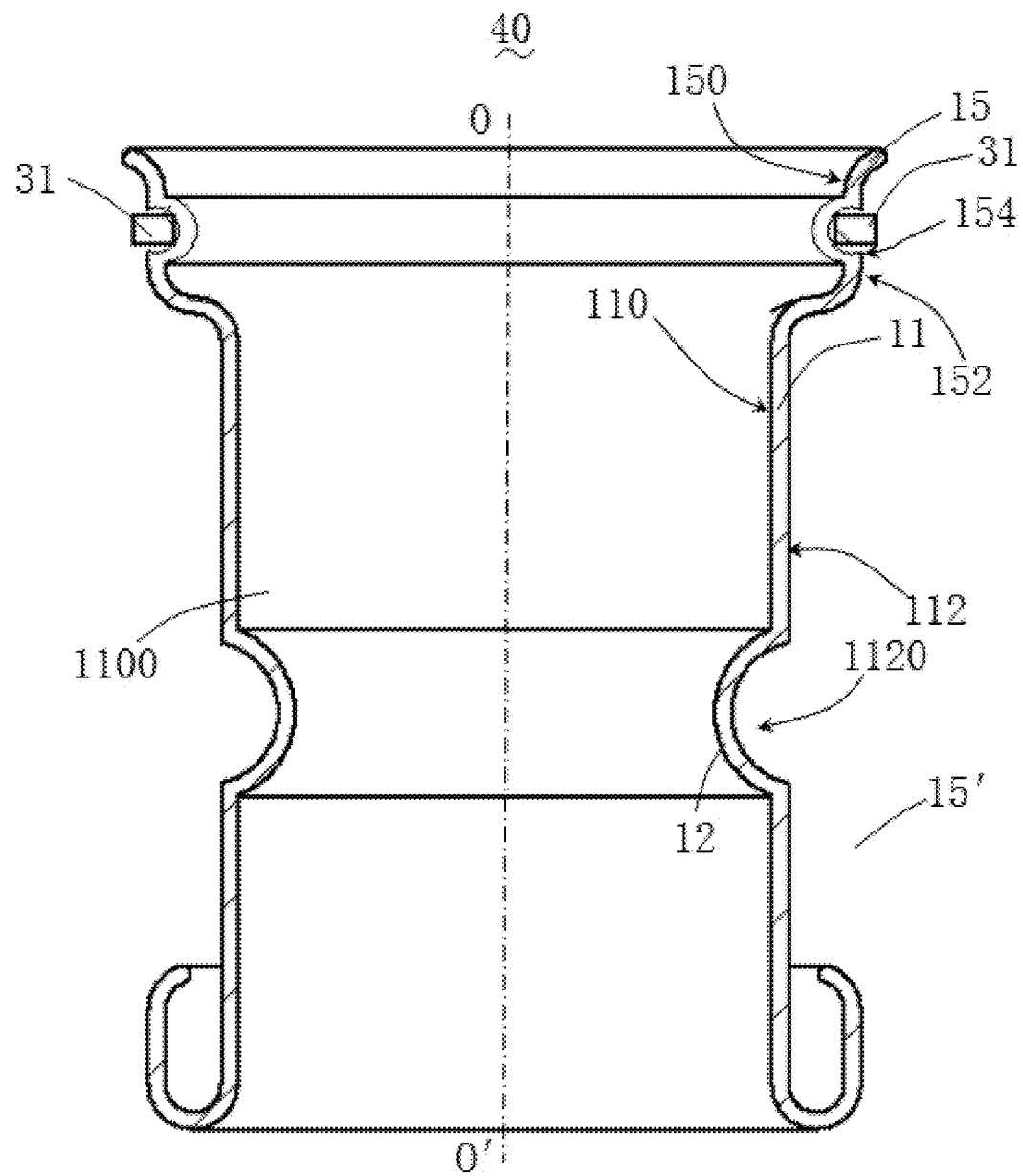
FIG. 12 is a schematic perspective structural diagram of the protective component according to Embodiment 3 of the present disclosure when in a folded state and fastened.

Embodiment 3 of the present disclosure provides another protective component (hereinafter referred to as protective component 40). Referring to FIG. 8 to FIG. 12, FIG. 8 is a schematic perspective structural diagram of a protective component according to Embodiment 3 of the present disclosure, FIG. 9 is a sectional view of the protective component according to Embodiment 3 of the present disclosure, FIG. 10 is a schematic perspective structural diagram of the protective component according to Embodiment 3 of the present disclosure is in a flipped state, FIG. 11 is a sectional view of the protective component according to Embodiment 3 of the present disclosure is in a flipped state, and FIG. 12 is a sectional view of the protective component according to Embodiment 3 of the present disclosure is in a flipped state and tightened. The protective component 40 according to Embodiment 3 of the present disclosure is substantially the same as the protective component 10 according to Embodiment 1 of the present disclosure, and the protective component 40 according to Embodiment 3 includes a tubular sidewall 11 and a limiting portion 12 the same as those of the protective component 10 according to Embodiment 1, which are not described in detail. The difference lies in that, in Embodiment 3, the tubular protective portion is a tubular flange.

Figure 8:
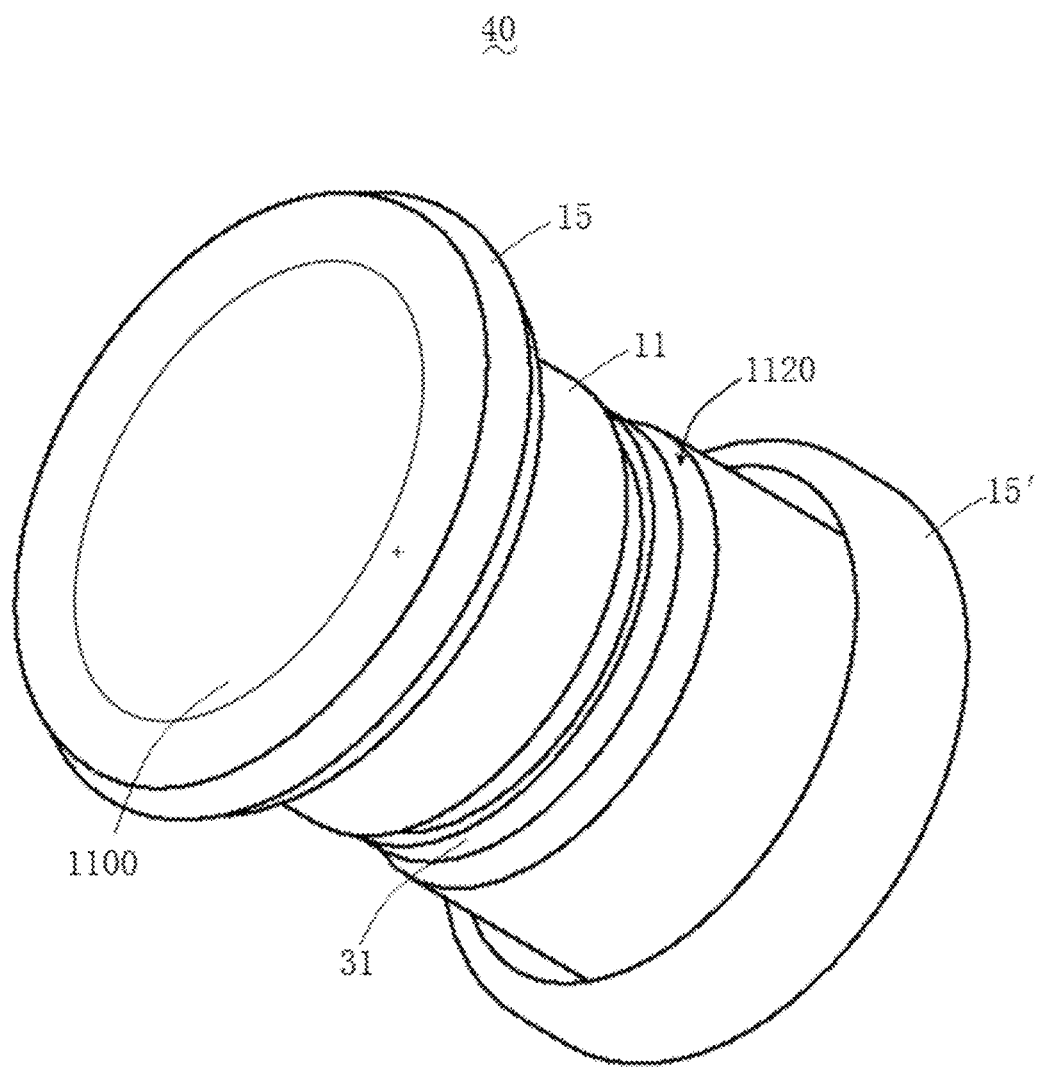
FIG. 8 is a schematic perspective structural diagram of a protective component according to Embodiment 3 of the present disclosure.
Figure 9:
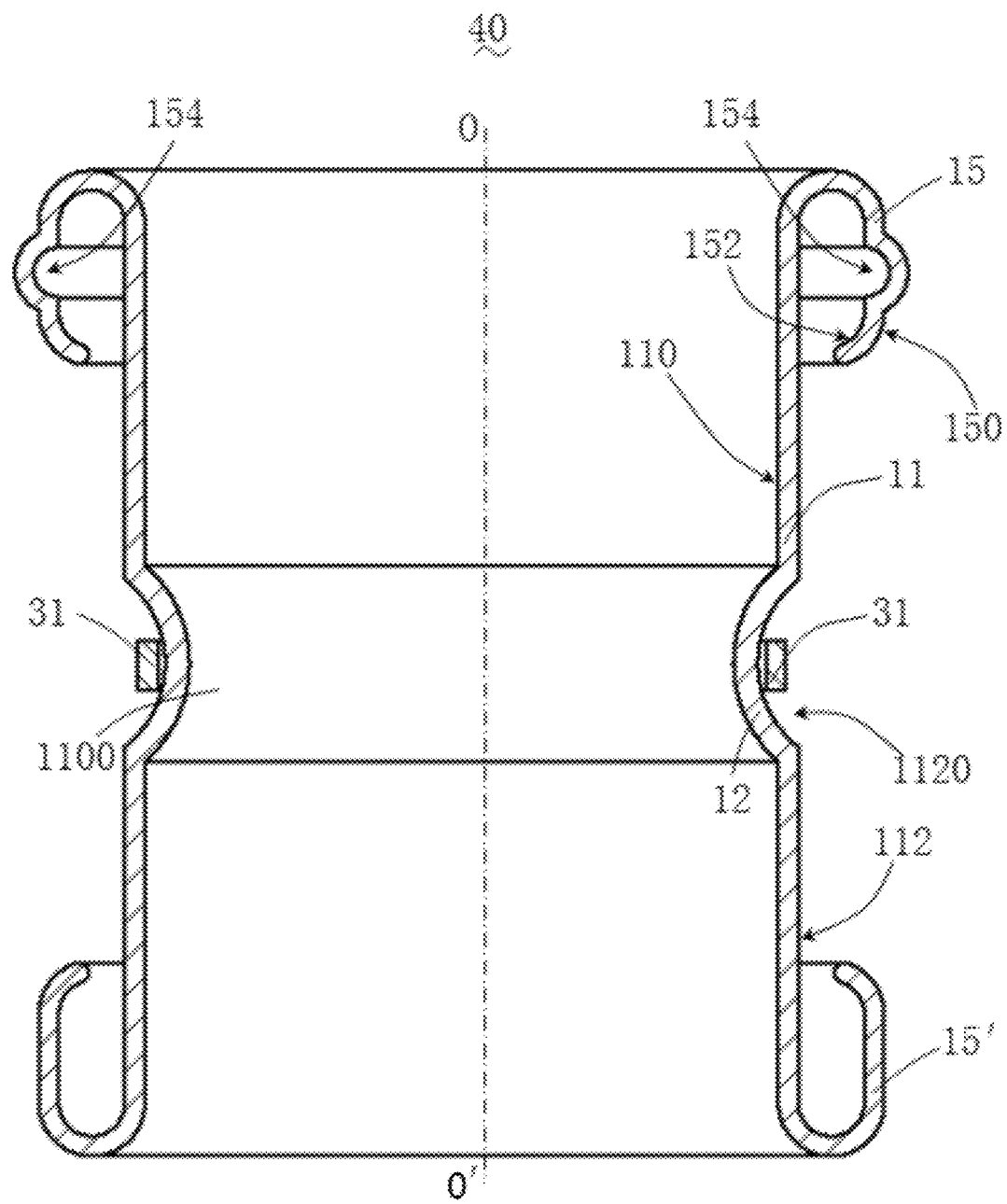
FIG. 9 is a sectional view of the protective component according to Embodiment 3 of the present disclosure.

Referring to FIG. 8 and FIG. 9, a tubular flange 15 is connected to the tubular sidewall 11 and disposed around the tubular sidewall 11. The tubular flange 15 is formed by folding outward from the tubular sidewall 11 and extends along a first direction close to one end of the tubular sidewall 11 (a bottom end of the tubular sidewall 11 shown in FIG. 9), and the tubular flange 15 is folded relative to the tubular sidewall 11 under an external force to extend in a direction opposite to the first direction to cover the end portion of the tubular sidewall 11 (a top end of the tubular sidewall 11 shown in FIG. 9) therein, as shown in FIG. 10 and FIG. 11.

For example, the tubular flange 15 is a tubular structure connected to an edge of one end of the tubular sidewall 11 (the top end of the tubular sidewall 11 shown in FIG. 9) and disposed around the tubular sidewall 11. The tubular flange 15 is folded outward from the edge of the top end of the tubular sidewall 11 and extends toward a direction (the first direction) close to the bottom end of the tubular sidewall 11. The tubular flange 15 is a flexible (deformable) structure made of an elastic material, and it may be folded relative to the tubular sidewall 11 under an external force to extend in a direction facing away from the bottom end of the tubular sidewall 11 (the direction opposite to the first direction), as shown in FIG. 10 and FIG. 11.

In this way, the foldable tubular flange 15 may assume two states:

State a: when the foldable tubular flange 15 is in the state shown in FIG. 8 and FIG. 9, an additional buffer protection is provided around the tubular sidewall 11. The wire box connector 20 wrapped with the tubular sidewall 11 and the tubular flange 15 is less likely to collide with a solar cell module to cause micro-cracks. Besides, in a process before the assembly of the solar module, when the wire box connector 20 accommodated in the tubular sidewall 11 is working in a pipeline, the tubular flange 15 may contact other elements before interference from the tubular sidewall 11 and the other elements, so as to prevent the wire box connector 20 or the tubular sidewall 11 fitting the wire box connector 20 from being impacted, thereby protecting the wire box connector 20.

State b: when the foldable tubular flange 15 is in the state shown in FIG. 10 and FIG. 11 (folded state), when "the wire box connector assembled to the solar cell panel module is plugged into another component (e.g., a test device connector)", the tubular flange 15 may be folded to extend toward a direction opposite to the first direction to cover the end portion of the tubular sidewall therein, and then the tubular flange is configured to cover the other components (e.g., the test device connector) extending into it, to avoid microcracks caused by the other components (e.g., the test device connector) hitting the solar cell module, so that the same component with different operating states may play different roles in different assembly processes. In an embodiment, the thickness of the tubular flange 15 is greater than that of the tubular sidewall 11. The thickness of the tubular flange 15 disposed around the tubular sidewall 11 is designed to be larger, which may further improve the protection effect of anti-impact of the tubular flange 15.

In addition, the protective component 30 may further include a collar 31 sleeved on the tubular sidewall, and the tubular flange 15 includes a first wall surface 152 connected to an outer wall surface 112 of the tubular sidewall 11 and a second wall surface 150 disposed opposite to the first wall surface 152 and connected to the inner wall surface 110 of the tubular sidewall 11, and the first wall surface 152 is provided with an annular groove 154 around a central axis OO' of the tubular sidewall. The collar 31 is made of an elastic material, and may be embedded into the annular groove 154 and fastening the tubular flange 15 when the tubular flange 15 is folded relative to the tubular sidewall 11 under the external force (in the above folded state), as shown in FIG. 12. With such configuration, after the tubular flange 15 covers the other components (e.g., the test device connector) extending into it, relative positions between the tubular flange 15 and the other components may be secured by fastening the collar 31 of the tubular flange 15, thereby avoiding sliding between the tubular flange 15 and the other components and improving the protection effect. It is worth mentioning that when the tubular flange 15 is in a non-folded state (the state described in the state a), since the collar 31 does not perform a fastening function, in this embodiment, the collar 31 is sleeved and secured in a first groove 1120. It may be understood that when there is no need to use the collar 31 to fasten the tubular flange 15, the collar 31 may also be sleeved and secured on the outer wall surface 112 outside the first groove 1120.

Figure 13:
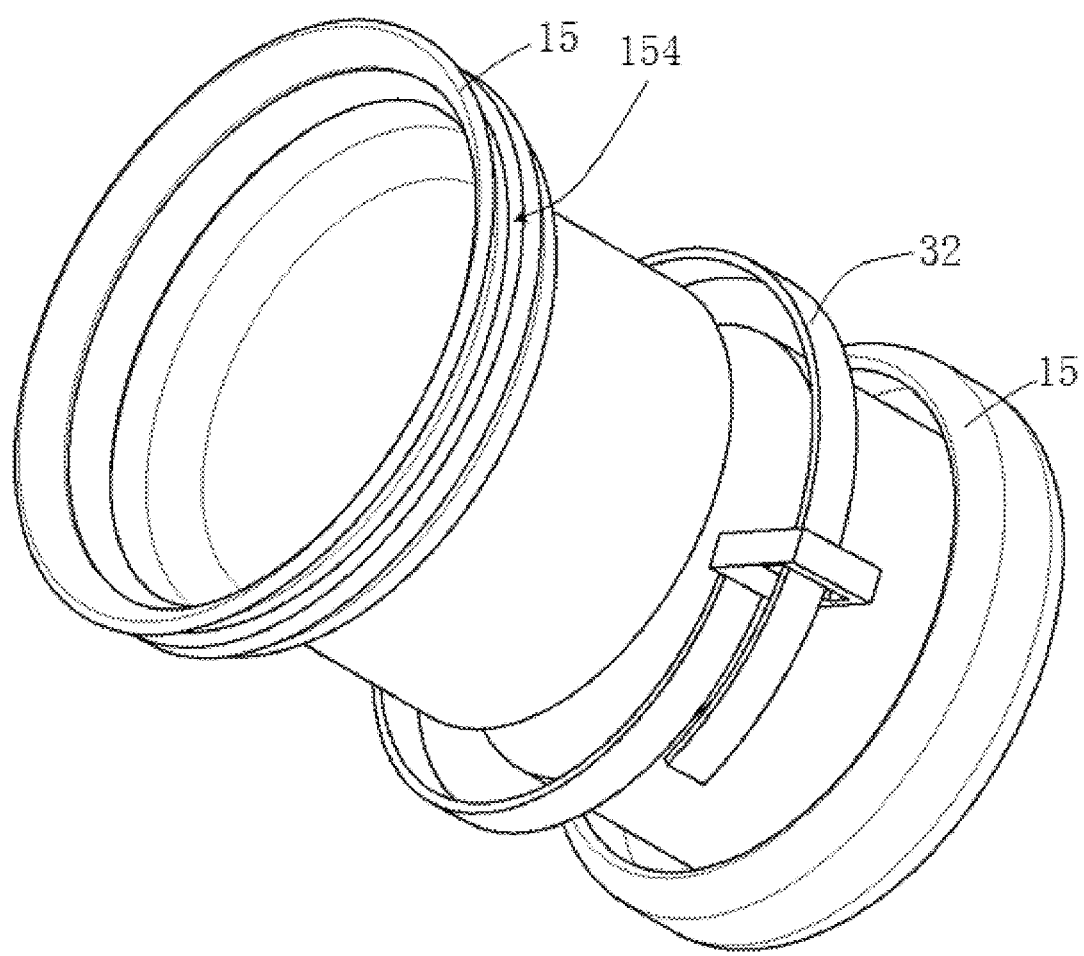
FIG. 13 is a schematic perspective structural diagram of a protective component with a binding tape according to Embodiment 3 of the present disclosure.

Alternatively, the above collar 31 may also be replaced with a binding tape 32, as shown in FIG. 13. Its binding function is similar to that of the collar 31, and is not described in detail here. In an embodiment, the binding tape 32 is made of a flexible material, thereby preventing the binding tape 32 from impacting the solar cell module back panel to cause micro-cracks to the solar panel.

In an embodiment, the annular groove 154 is provided with a skidproof stripe (not shown in the figure). With such configuration, the friction between the collar 31/binding tape 32 and the tubular flange 15 may be improved to avoid relative sliding between the collar 31/binding tape 32 and the tubular flange 15, thereby improving a tightening/fastening effect between the collar 31/binding tape 32 and the tubular flange 15.

In addition, in this embodiment, the protective component further includes an annular protrusion 156 provided on the second wall surface 150 and directly facing the annular groove 154. With such configuration, a fixing effect between the other components (e.g., the test device connector) plugged into the wire box connector 20 and the tubular flange 15 may be improved by aligning or buckling the annular protrusion 156 with or into the other components (e.g., the test device connector). Furthermore, a surface of the annular protrusion 156 is provided with a skidproof stripe (not shown in the figure). In this way, the friction force may be increased, and the fixing effect between the other components (e.g., the test device connector) plugged into the wire box connector 20 and the tubular flange 15 may be further improved.

It should be indicated that another tubular flange 15' connected to an edge of the other end of the tubular sidewall 11 (the bottom end of the tubular sidewall 11 shown in FIG. 9) and disposed around the tubular sidewall 11 is further illustrated in FIG. 8 and FIG. 9. The tubular flange 15' is folded outward from the edge of the bottom end of the tubular sidewall 11 (that is, the upward direction in the diagram of FIG. 9) and extends toward a direction close to the top end of the tubular sidewall 11. The material and function of the tubular flange 15' are similar to those of the tubular flange 15. It may be understood that the tubular flange 15' and the tubular flange 15 may also be interchanged, the tubular flange 15' of the tubular sidewall 11 may be replaced with the tubular flange 15, and the tubular flange 15 of the tubular sidewall 11 may also be replaced with the tubular flange 15'.

Figure 14:
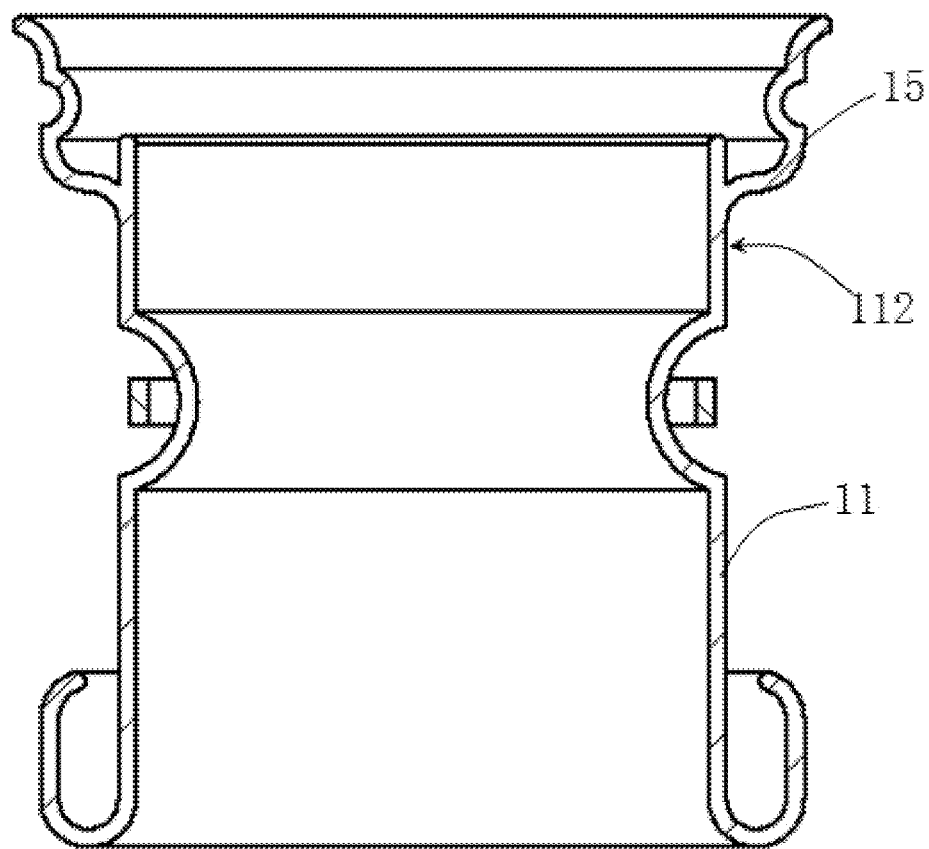
FIG. 14 is a sectional view of another protective component according to Embodiment 3 of the present disclosure.

In addition, alternatively, the tubular flange 15 is not limited to extending and being folded outward from the edge of the top end of the tubular sidewall 11 (the top end of the tubular sidewall 11 shown in FIG. 14), and may also be folded outward from a position on the outer wall surface 112 of the tubular sidewall 11 and facing away from the edge as shown in FIG. 14. Its working principle is substantially similar to that in the above solution, and is not described in detail here.

Figure 15:
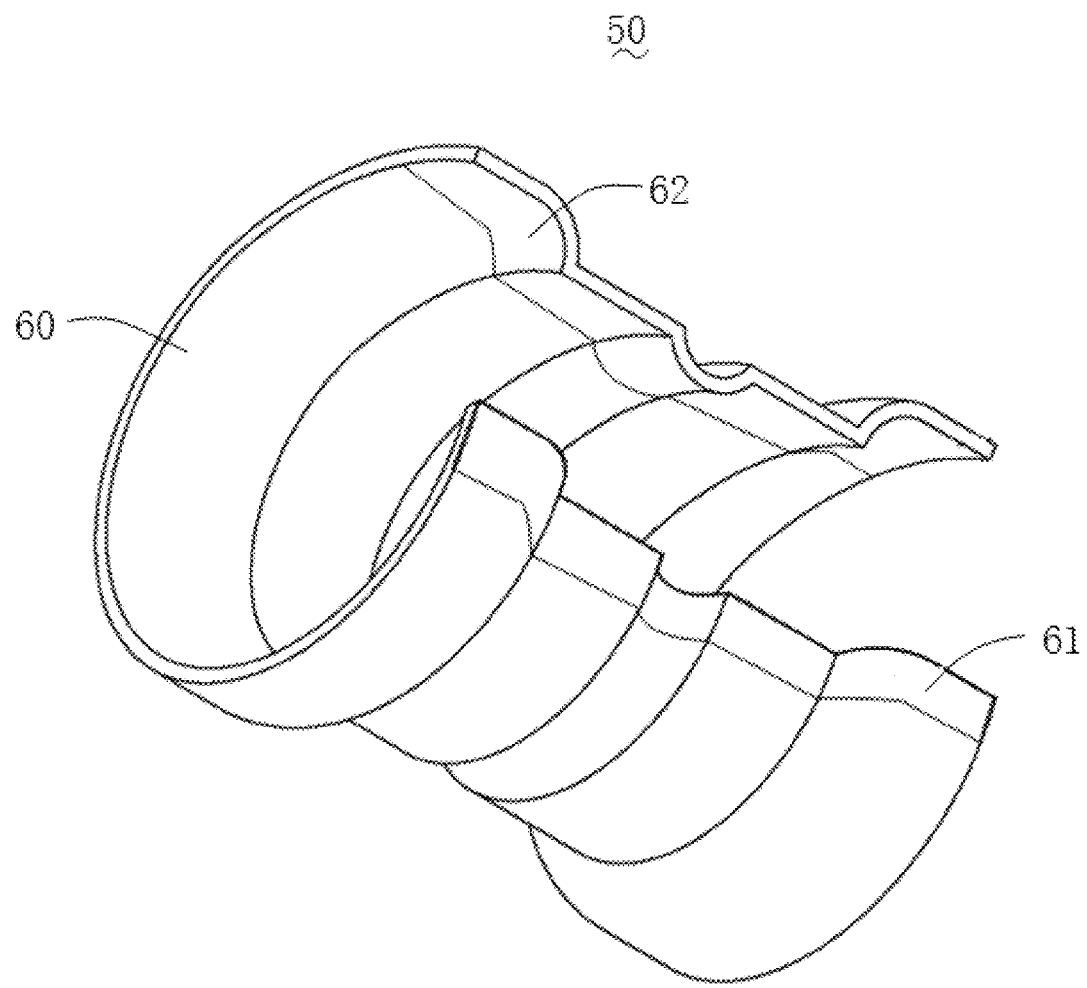
FIG. 15 is a schematic perspective structural diagram of a protective component according to Embodiment 4 of the present disclosure.

Embodiment 4 of the present disclosure provides another protective component (hereinafter referred to as protective component 50). Referring to FIG. 15, the protective component 50 according to Embodiment 4 is substantially the same as the protective component 30 according to Embodiment 2. The difference lies in that, in Embodiment 4, the protective component 50 is made of a sheet material 60 coiled and connected end to tail.

In an embodiment, before the sheet material 60 is coiled, a first adhesive portion 61 is provided on an outer side of one end of the sheet material 60, and a second adhesive portion 62 is provided on an inner side of the other end of the sheet material 60. During use, the wire box connector 20 may be first placed on a surface of the sheet material 60, and then the sheet material 60 is coiled and the first adhesive portion 61 and the second adhesive portion 62 are adhered to each other.

In addition, it should be noted that in use, the sheet material 60 may also be firstly coiled, then a first adhesive portion 18 and a second adhesive portion 19 are adhered to each other to form a protective component 50, and the protective component 50 is sleeved on the wire box connector 20.

It should be noted that on the basis of the protective components according to Embodiments 1, 2, 3, and 4, the tubular sidewall 11 may be further additionally provided with an easy-to-tear opening. After the wire box connector 20 is tested and assembled, the protective component may be removed through the easy-to-tear opening, which is simple and convenient to operate.

Those of ordinary skill in the art should understand that the above implementation modes are specific embodiments for implementing the present disclosure, and in practical application, various changes may be made in form and details without departing from the spirit and scope of the present disclosure. The protection scope of the present disclosure should be subjected to the scope defined by the appended claims.

What is claimed is:

1. A protective component for a wire box connector, comprising:
    a tubular sidewall being elastic and encloses to form a through hole for receiving the wire box connector;
    a limiting portion provided on an inner wall surface of the tubular sidewall and configured to clamp a recess on the wire box connector; and
    a tubular protective portion being elastic and is connected to the tubular sidewall to cover an end portion of the tubular sidewall,
    wherein the tubular protective portion is a tubular flange connected to the tubular sidewall and disposed around the tubular sidewall, the tubular flange is folded outward from the tubular sidewall and extends along a first direction close to one end of the tubular sidewall, and the tubular flange is foldable relative to the tubular sidewall under an external force to extend in a direction opposite to the first direction to cover the end portion of the tubular sidewall.

2. The protective component according to claim 1, wherein the tubular flange is folded outward from an edge of one end of the tubular sidewall and extends toward a direction close to the other end of the tubular sidewall, and the tubular flange is foldable relative to the tubular sidewall under an external force to extend in a direction facing away from the other end of the tubular sidewall.

3. The protective component according to claim 2, further comprising a collar sleeved on the tubular sidewall, wherein
the tubular flange comprises a first wall surface connected to an outer wall surface of the tubular sidewall and a second wall surface opposite to the first wall surface and connected to the inner wall surface of the tubular sidewall, and the first wall surface is provided with an annular groove around a central axis of the tubular sidewall, and
the collar is made of an elastic material and is capable of being embedded into the annular groove and fastening the tubular flange when the tubular flange is folded relative to the tubular sidewall under the external force.

4. The protective component according to claim 2, further comprising a binding tape, wherein
the tubular flange comprises a first wall surface connected to an outer wall surface of the tubular sidewall and a second wall surface opposite to the first wall surface and connected to the inner wall surface of the tubular sidewall, and the first wall surface is provided with an annular groove around a central axis of the tubular sidewall, and
the binding tape is made of a flexible material and is capable of being embedded into the annular groove and fastening the tubular flange when the tubular flange is folded relative to the tubular sidewall under the external force.

5. The protective component according to claim 3, further comprising a skidproof stripe provided in the annular groove.

6. The protective component according to claim 4, further comprising an annular protrusion provided on the second wall surface and directly facing the annular groove.

7. The protective component according to claim 6, wherein a surface of the annular protrusion is provided with a skidproof stripe.

8. The protective component according to claim 1, wherein a thickness of the tubular flange is greater than a thickness of the tubular sidewall.

9. The protective component according to claim 1, wherein the tubular protective portion is a sleeve connected to the tubular sidewall, the sleeve extends from an edge of one end of the tubular sidewall toward a direction facing away from the other end of the tubular sidewall, and in a radial direction of the tubular sidewall, a cross-sectional area of the sleeve is greater than a cross-sectional area of the tubular sidewall.

10. The protective component according to claim 9, wherein an inner diameter of the sleeve is greater than an inner diameter of the tubular sidewall.

11. The protective component according to claim 10, wherein a sidewall thickness of the sleeve is greater than a thickness of the tubular sidewall.

12. The protective component according to claim 1, wherein a width of the limiting portion in an axial direction of the tubular sidewall is in a range from 13 mm to 17 mm.

13. The protective component according to claim 1, wherein the limiting portion is provided with a skidproof stripe.

14. The protective component according to claim 1, wherein a first groove recessed toward the limiting portion is provided on an outer wall surface of the tubular sidewall at a position directly facing the limiting portion.

15. The protective component according to claim 1, wherein the tubular sidewall is provided with an easy-to-tear opening.

16. The protective component according to claim 1, wherein the inner wall surface of the tubular sidewall is provided with a skidproof stripe.

17. The protective component according to claim 1, wherein the tubular sidewall, the limiting portion, and the tubular protective portion are integrally formed.

18. The protective component according to claim 1, wherein the protective component is made of a sheet material coiled and connected end to tail.

19. The protective component according to claim 1, wherein the protective component is made of silica gel.

* * * * *